United States Patent [19]

Jeffers et al.

[11] 4,248,959
[45] Feb. 3, 1981

[54] PREPARATION OF DIAZO PRINTING PLATES USING LASER EXPOSURE

[75] Inventors: William Jeffers, Fair Haven; Douglas Seeley, High Bridge, both of N.J.; Raimund J. Faust, Wiesbaden, Fed. Rep. of Germany; Shuchen Liu, New Providence, N.J.

[73] Assignee: American Hoechst Corporation, Bridgewater, N.J.

[21] Appl. No.: 967,524

[22] Filed: Dec. 7, 1978
(Under 37 CFR 1.47)

Related U.S. Application Data

[63] Continuation-in-part of Ser. No. 694,641, Jun. 10, 1976, abandoned.

[51] Int. Cl.² .......................... G03F 7/08; G03G 5/18
[52] U.S. Cl. .................................... 430/300; 430/141; 430/175; 430/177; 430/302; 430/926; 430/945
[58] Field of Search ............... 96/91 R, 75, 49, 27 H, 96/33, 36.3, 36.4; 430/141, 175, 177, 300, 302, 926, 945

[56] References Cited

U.S. PATENT DOCUMENTS

| | | | |
|---|---|---|---|
| 2,702,242 | 2/1955 | Neugebauer | 96/91 R |
| 2,871,119 | 1/1959 | Weegar et al. | 96/75 |
| 3,260,599 | 7/1966 | Lokken | 96/49 |
| 3,567,453 | 3/1971 | Borden | 96/91 R |
| 3,615,452 | 10/1971 | Cerwonka | 96/49 |
| 3,628,954 | 12/1971 | Robillard | 96/49 |
| 3,637,375 | 1/1972 | Levinos | 96/91 R |
| 3,664,737 | 5/1972 | Lipp | 96/91 R |
| 3,679,419 | 7/1972 | Gillich | 96/91 R |
| 3,778,274 | 12/1973 | Inoue et al. | 96/91 R |
| 3,850,633 | 11/1974 | Moraw et al. | 96/91 R |

OTHER PUBLICATIONS

Kosar, J., "Light-Sensitive Systems", J. Wiley & Sons, 1965, pp. 197-199, 201 and 294.
Dinaburg; M. S., "Photosensitive Diazo Cpds", Focal Press, 1964, pp. 22-25 and 154-157.
Londan, R., "Diazo Cpds in the Photocopying Industry", J. of Photo Sci. & Eng., 1965, pp. 144-151.

Primary Examiner—Charles L. Bowers, Jr.
Attorney, Agent, or Firm—James E. Bryan

[57] ABSTRACT

This invention relates to an improvement in a photochemical process for the preparation of printing plates wherein a printing plate comprising a photosensitive composition coated on a support is exposed to a pattern of laser light, the intensity of which light is modulated in accordance with an input source of information, and said printing plate is subsequently developed by removal from said support of that portion of the photosensitive coating composition which is not exposed to said pattern of laser light, the improvement comprising utilizing a pattern of laser light generated by a laser, and utilizing as a photosensitive composition a mixture consisting essentially of: (1) a negative-working condensate of a para-amino benzene diazonium compound present in an effective amount sufficient to sensitize said photosensitive composition to laser light, and (2) a colorant capable of absorbing light in the spectral range between about 450 –550 nm, said colorant selectively sensitizing the condensate to said laser light at a wavelength greater than about 450 nm, and being selected from the group consisting of azo, triarylmethane, xanthene and methine compounds.

14 Claims, 1 Drawing Figure

U.S. Patent  Feb. 3, 1981  4,248,959
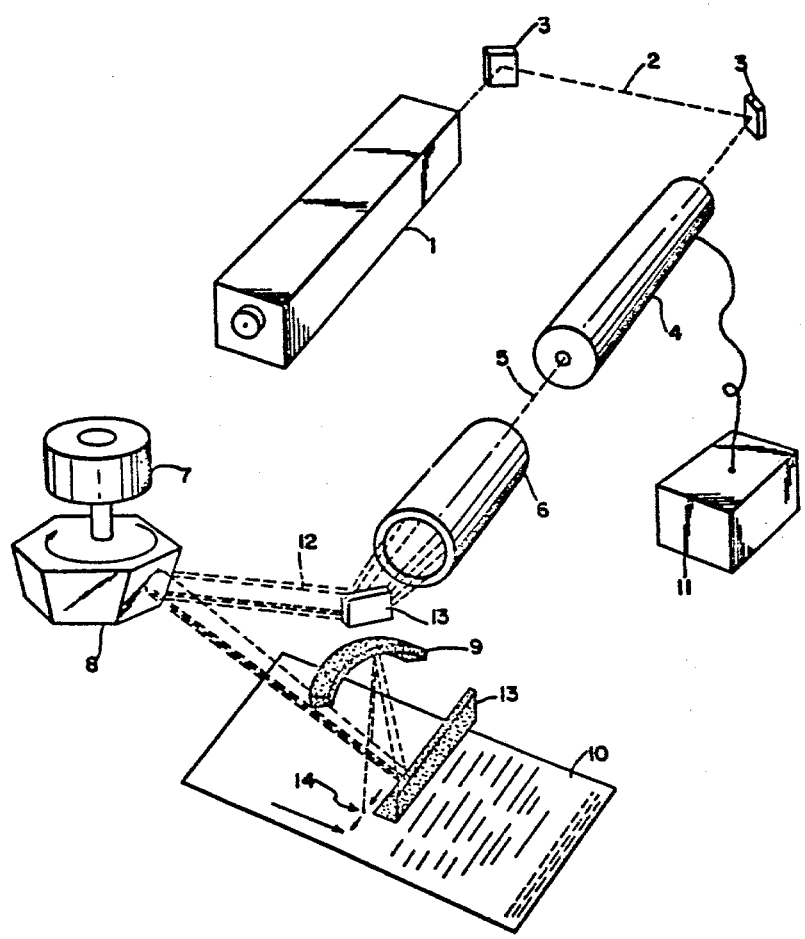

PREPARATION OF DIAZO PRINTING PLATES USING LASER EXPOSURE

This application is a continuation-in-part of copending application Ser. No. 694,641, now abandoned, filed June 10, 1976.

In copending application Ser. No. 694,693, now abandoned, filed June 10, 1976, there is disclosed that negative working diazonium compounds comprising a coating on a support are sensitive to laser light from which substantially all UV light has been removed.

FIELD OF THE INVENTION

This invention relates to the preparation of printing plates and specifically to the composition of coatings for the economical reproduction of images using laser exposure sources.

DESCRIPTION OF THE PRIOR ART

One of the first steps in the process of making printing plates is the imagewise exposure of a coating which has been applied to a suitable support. Typical is a diazonium type photosensitive coating primarily sensitive to actinic light of a wavelength of between 350 to 420 nm. The design to be reproduced is generally formed by imagewise exposing the surface to uniform actinic radiation, using a positive or negative imaged transparency, followed by one or more steps of development and other treatments well known to the art.

The transparency is usually prepared by photographing the original art work or copy. Its preparation may require several time consuming steps each of which can reduce the quality of the image on the prepared plate.

To an ever increasing extent, images for photographic transferral to printing plates are being arranged and even generated by computers. These images include computer generated characters for phototypesetting, computerized copy editing and justification, and computerized scanning and halftone "screening" of continuous-tone pictures. These images may first appear in "soft" form (on a cathode ray tube display device) and then be made into a "hard" copy, for example a photographic transparency to be used as a light mask. Both the processes of hard copy preparation and image transferral generally involve several critical, and at times also costly steps. It is thus most desirable to reduce the many steps involved and thus to simplify the procedure of plate make ready as well as to reduce costs. Most desirable would be to eliminate the need for the transparency entirely and to generate the image directly on the printing member.

A process for the preparation of printing plates which is able to generate letterpress printing plates directly from computer generated "soft" images is the Laser-Graph ® system of Laser Graphics Systems, Inc. This type of system is described in U.S. Pat. No. 3,832,948, assigned to Empire Newspaper Supply Corporation and U.S. Pat. No. 3,461,229, Oppenheimer. FIG. 1 and the description thereof outlines a common embodiment of a laser scanning system. As the subject is scanned in a raster, or line-by-line manner, the information controlling modulation is delivered to the system in a sequential manner, making the laser system ideal for interfacing with a computer. The method has been used to prepare plates from images either stored on magnetic tape or generated at another location by means of a laser scanning reading unit similar to the imaging unit of FIG. 1 and transmitted electrically by wire; similar arrangements are described in U.S. Pat. No. 3,506,779, assigned to Bell Telephone Laboratories, Inc.

The concept of using laser light to expose photosensitive coatings also has been reported in several publications and patents. For instance, U.S. Pat. No. 3,664,737 to Lipp describes the use of UV emitting lasers such as argon ion, helium-cadmium, krypton ion, and neon to expose sensitized aluminum offset plates such as Litho-Chemical and Supply Company's Kem-Lon Pre-cote and Minnesota Mining and Manufacturing's "R" plate. Both of these plates use diazo sensitizers. Lipp's avowed object is to use a laser beam to expose a photosensitive medium which is sensitive to the wavelength emitted by the laser. (Contrary to the statement in Lipp (Col. 4, lines 11-14) it is universally accepted that the UV region of the electromagnetic spectrum comprises wavelengths below about 400 nm to about 40 nm, the upper limit of X-Rays.) Lipp uses specific means to scan a subject, other specific means to deflect the laser beam and controlled light deflection apparatus to provide a raster of discrete spots of light along a single line to expose the diazo or other photosensitive medium. The patent states that in the prior art laser-etched printing plate, thermal energy cannot be removed quickly enough to enable laser etching to compete in speed with chemical etching. Although improvement of production of high quality printing plates is an object of Lipp's invention, increase in speed of exposure to compete with conventional exposure coupled with chemical etching is not an avowed object, nor is improved speed of Lipp's product asserted. German Offenlegungschrift (DOS) No. 2,318,133, assigned to W. R. Grace and Company and DOS No. 2,302,398, assigned to DuPont, both describe photohardening of photopolymerizable compositions by laser light in the wavelength range of 300 to 400 nm from an UV-emitting laser (argon ion and krypton lasers, respectively).

In the Grace patent, the photopolymerizable materials include polyvinyl cinnamates, methacrylates, and polymethacrylates in the presence of photoinitiators such as benzoin and anthraquinone. Also present are colloids and polymers such as polyvinyl alcohols cross-linkable in the presence of chromium salts, latices of polyvinyl acetate, polyvinyl chloride, polyacrylonitrile, and the like. Other photopolymers include a polyene-/polythiol mixture with accelerators including diarylketones, triarylphosphines and others previously described in the patent literature.

A scanner is not used in the DuPont patent and the exposure is made with a krypton laser on the DuPont photopolymer "Lydel ®, Dycril ® plates and Cronavure ® resist film. The patent states that the krypton laser yields UV radiation at 350.7 nm and 356.4 nm.

In U.S. Pat. No. 3,847,771, to SCM Corp., a laser is used to photoharden ethylenically unsaturated compositions.

DOS No. 25 00 906 Al to Scott Paper Company uses a YAG or Argon laser to remove the carbon particle plus nitrocellulose portion of a coating composition by infrared radiation. The diazo part of the composition is now photohardened in a conventional manner by overall exposure to the ultraviolet radiation of a carbon arc lamp. This patent shows that the inventors found the radiation energy of these lasers to be insufficient for direct imaging of a diazo coating.

U.S. Pat. No. 3,506,779, to Bell Labs describes an apparatus for forming relief plates comprising a laser which removes material from the surface by vaporization. The intensity and deflection of the beam may be programmed by a computer.

U.S. Pat. No. 3,549,733 to DuPont similarly uses a controlled laser beam of sufficient intensity to decompose the polymers of which the plate is composed and so form depressions, thus forming a polymeric relief printing plate. A $CO_2$ gas laser of high intensity is recommended. Subject scanning and beam modulation are not discussed.

DOS No. 2,060,661 to Applied Display Services, DOS No. 2,157,630 to Berg, and U.S. Pat. No. 3,574,657 to FMC, all report the use of visible or infrared radiation to perform mechanical or thermal work such as melting, vaporizing or ablating a coating to form a printing plate.

All uses of the laser which involve imaging by means of ablation instead of photohardening are economically inferior because of high power requirements, attendant high cost of cooling, and the like.

Printing plates coated with presensitized negative working diazos have attained high acceptance in the lithographic printing industry under standard noncoherent light sources because of their high resolution and excellence of images obtained, easy processing, trouble-free printing, and the great length of press runs which are obtainable.

Others e.g. Lipp (supra) have suggested that it would be desirable to join the computer technology described above to the use of a laser beam to expose conventional presensitized negative working diazo offset coatings at a commercially useful speed.

This has not been possible because of the mismatch of laser light output and diazo coating spectral sensitivity. Even with the most powerful, yet practical laser (argon ion lasers operating at between 10–20 watts), the UV output (at 370 nm) is only 1.2% of its total energy when operating in the all-line mode and with optics that do not filter out the UV. The balance of the output is above 450 nm (in the region of 457.9 to 514.5 nm) with the bulk of power in two lines at 488.0 and 514.5 nm. In contrast, diazo coatings are primarily sensitive below 420 nm, with negligible sensitivity above 450 nm as described in TAGA Proceedings Preprint "Spectral Sensitivity of Offset Printing Plates" by Robert E. Gesullo and Peter G. Engeldrum. With argon ion laser UV emission so low, diazo coating exposure in a practical time due to available UV radiation is not to be expected.

It has been estimated by printing industry experts that a direct exposure system to be economically justifiable must be at least equivalent in cost to known methods of imaging: i.e. preparing photographic transparencies followed by exposing sensitized plates and accomplished within a reasonable period of time. A practical speed has been considered to be 2–3 minutes to expose a newspaper page or 0.3–0.5 secs/in.$^2$ when scanning techniques are to be used.

In the copending application, supra, there is disclosed that negative working diazonium compounds comprising a coating on a support are sensitive to laser light from which substantially all UV light has been removed. However surprising and valuable this finding, greater exposure speed is desirable.

It is well-known that dyes or pigments which absorb actinic light generally decrease the sensitivity of so dyed, diazo coatings to actinic radiation. Nonetheless, certain thio- and selenopyronine dyes are claimed to increase the speed of colored, polar diazonium compounds, as described in German Pat. No. 745,595 (1944) assigned to I. G. Farbenindustrie A.G. Also, some colorless "optical brighteners" (compounds absorbing ultraviolet light which fluoresce in the actinic region of diazonium compounds) are said to attain a similar effect with diazonium compounds, as reported in Belgian Patent No. 661,789 (1965) assigned to Kalle, A.G. Finally, a number of colorless diazonium compounds are claimed to have been improved in the solid state by means of ultraviolet light-absorbing compounds, as reported in German Pat. Nos. 906,405 (1954), 903,061 (1954) and 763,388 (1952), all assigned to Kalle, A.G. and U.S. Pat. No. 1,972,323 (1934) to Shiraeff & Jacobs. However, in no instance as far as applicants are aware, has it been possible to sensitize a diazo compound to respond rapidly to actinic light outside of the region in which diazonium compounds are known to be sensitive; for instance to electromagnetic radiation in the range of between 450 to 550 nm. It thus has come as a surprise to find that inexplicably certain coloring matter absorbing light in the region of 450 to 550 nm can be used to render certain diazo based coatings sensitive to exposure to radiation outside of the known sensitivity of these diazos. This unexpected finding makes it practical for the first time, for instance, to use an argon ion laser scanning device to prepare printing members directly from copy with no intervening photographic steps.

SUMMARY OF THE INVENTION

This invention comprises a diazo coating composition especially useful for making a stencil by means of exposure to laser light. The diazo coating may be composed of a diazo type photosensitive compound such as a negative-working polymeric condensation product of a substituted para-arylaminobenzene diazonium salt with a dialkoxyaromatic compound, and a sensitizing dye capable of absorbing light in the spectral range between 450–550 nm such as dyes from the azo, triarylmethane, xanthene, or methine classes. Optionally, there may be added a resin such as styrene-maleic anhydride copolymer or a polyvinyl acetal resin, a mineral or strong organic acid and an indicating dye such as 4-phenylazodiphenylamine.

The preparation of products which require the formation of stencils in the course of their normal use, follow known technology. For instance, a solution of all solid components is coated upon a prepared carrier and the solvent is evaporated. If this solution is coated, for instance, on a thin aluminum sheet, as conventionally used for making offset printing plates, a presensitized offset printing plate is prepared. If the coating, properly formulated, is coated onto a magnesium plate as conventionally used for making a letterpress plate, a presensitized letterpress plate is prepared. Many other examples are possible and all are included within the scope of this invention.

DETAILED DESCRIPTION OF THE INVENTION

The invention is the use of imageable diazo coatings particularly suitable for exposure to laser light to which the diazos themselves are substantially insensitive. The invention is particularly concerned with the formation of images as required for making printing members such as printing plates. Such printing plates comprise a carrier and a homogeneous light-sensitive coating containing, for instance, a negative working diazonium compound and a colorant selected from the azo, triarylmethane, xanthene, and methine classes. Optionally, the coating may also contain resins such as phenolics, polyvinylformal and vinyl copolymers containing some carboxylic acid groups or other aqueous alcohol- and base-soluble resins, a small quantity of mineral acid such as sulfuric or phosphoric acid or an organic acid such as alkyl or aryl sulfonic, sulfuric, phosphoric, or phosphonic. An indicator dye also may be used.

CARRIER

The carrier may be plastic film or foil or of metal such as magnesium or aluminum. Aluminum, with a well developed art of preparation, is a preferred carrier for lithographic purposes, and magnesium is a preferred carrier for letterpress purposes. The preparation of the carriers includes the steps of cleaning, mechanical graining, if desired, and/or etching, if desired, which may be performed purely chemically as by the use of acids and bases or electrochemically. If aluminum is used, further optional preparation steps include the procedure normally referred to as anodizing. The last step in preparation of, for instance, an aluminum carrier prior to coating with a light-sensitive coating may include silicating or alternatively the procedure described in U.S. Pat. No. 3,220,832. It is evident that dependent upon the graining, etching, anodizing, and like procedures used, the surface area will vary. In the statements made below describing coating components, the surface area referred to is merely that of the gross dimensions of the plate, disregarding the microtopography thereof.

DIAZONIUM COMPOUND

Negative working para-aminobenzenediazonium compounds must be used, such as those described in U.S. Pat. Nos. 3,849,392, 3,867,147, and 3,679,419. Representative examples of such negative working diazos are:

1. 3-methoxydiphenylamine-4-diazonium mesitylene sulfonate condensed with bis-(4-methoxymethylphenyl) ether,
2. 3-methoxydiphenylamine-4-diazonium sulfate condensed with bis-(4-methoxymethylphenyl) ether,
3. diphenylamine-4-diazonium chloride condensed with formaldehyde,
4. 3-methoxydiphenylamine-4-diazonium chloride condensed with formaldehyde.

These negative working diazonium compounds may be used in an amount from about 0.01 to about 0.8 gram per square meter and preferably from about 0.1 to about 0.5 gram per square meter. When the amount of the negative-working diazonium compounds in the coating is increased, the conventional exposure speed decreases, as is well known.

Surprisingly, under laser exposure, the exposure speed increases, showing a difference in kind due to laser light. Further, positive working diazos conventionally known as quinone diazides do not exhibit this dye-sensitized effect when exposed to laser radiation.

ACIDS

Mineral acids such as sulfuric or phosphoric or an organic acid such as an alkyl or aryl sulfonic, sulfuric, phosphoric or phosphonic are sometimes beneficial but not absolutely necessary. Such acids may be used in an amount of up to about 0.005 gram per square meter.

RESIN

A resin may be added to the coating composition to improve durability of the coating. However, the addition thereof is not necessary to the practice of the invention, which has as its purpose to greatly increase the speed of negative working diazo-type coatings to laser radiation. When desired, a resin may be used in an amount of up to about 3 grams per square meter.

INDICATOR DYE

An indicator dye may be added to the composition to show a color change directly upon exposure. The addition of such a dye is optional and, as its presence will not increase the speed of the plate, it should be selected with care in order not to reduce it unnecessarily. Examples of suitable indicating dyes are para-phenylazodiphenylamine, Metanil Yellow, C.I. No. 13065, Methyl Orange, C.I. No. 13025 and p-(p-anilinophenylazo) benzenesulfonic acid sodium salt. Such a dye may be used in an amount of up to about 0.1 gram per square meter.

SENSITIZING COLORANT

Not all colorants appear suitable. However, useful colorants include the classes of Azo, Triarylmethane, Xanthene, and Methine, as defined in The Colour Index, Third Edition, Volume 4, published by the Society of Dyers and Colourists, Bradford, England. Such colorants are preferably used in an amount from about 0.01 gram per square meter to about 0.5 gram per square meter and preferably from about 0.05 to 0.1 gram per square meter, to selectively sensitize to laser light having no UV component.

XANTHENES such as Acridine Red 3B (Colour Index No. 45000), Pyronine G (No. 45005), Rhodamine Scarlet G (No. 45015), C.I. Basic Red 1 (Rhodamine 6G) (No. 45160), Rhodamine 2G (No. 45165), Rhodamine 4G (No. 45166), C.I. Basic Violet 10 (Rhodamine FB) (No. 45170), Rhodamine 12 GF (No. 45315), Spirit Soluble Fast Pink B, and other xanthene type colorants which selectively sensitize these plates for laser exposure; or TRIARYLMETHANES such as C.I. Basic Red 9 (No. 42500), Tryparosan (No. 42505), C.I. Basic Violet 14 (No. 42510), C.I. Basic Violet 2 (Remacryl Magenta B) (No. 42520) and other triarylmethane-type colorants which selectively sensitize these plates for laser exposure; or METHINES such as C.I. Basic Violet 16 (Sandocryl Red B-6B) (No. 48013), C.I. Basic Violet 7 (No. 48020), Astrazone Violet R (No. 48030), and any other methine-type colorant which selectively sensitizes these plates for laser exposure; or AZOS such as Sudan Red BV (No. 11125), C.I. Solvent Red 3 (No. 12010), C.I. Solvent Yellow 14 (Sudan Yellow) (No. 12055), C.I. Solvent Orange 7 (No. 12140), C.I. Solvent Red 8 (No. 12715), C.I. Solvent Red 100 (Neozapon Red BE) (No. 12716), C.I. Acid Red 14 (No. 14720), Oracet Red B, Azo Eosin G (C.I. No. 14710), and any other azo-type colorant which selectively sensitizes these plates for laser exposure may be used.

In the practice of the invention, the prepared carrier is coated by conventional means with a sensitizing solution. The solvent is caused to evaporate whereupon the resulting member is ready for exposure, particularly to a laser source.

Lasers suitable for this invention are those which emit in the region above 450 nm, although they may also emit below 450 nm. Such lasers include the helium-neon which has spectral lines at 632.8, 1150 and 3390 nm; the argon ion which emits at specific lines between 333.7 and 528.7 nm, but with most of its energy in lines at 488.0 and 514.5 nm, the krypton which emits between 337 and 858 with a significant amount of its energy in lines above 450 nm and the $CO_2$ which emits at 1060. Of these lasers, the argon ion is preferred.

The laser source used in the Examples is an argon ion laser linked to a suitable scanning system wherein, for instance, a laser beam scanner and modulator deliver impulses from a laser beam to the coating directly. This equipment is by way of example only as it is evident that the invention resides in the interaction of the laser beam and the especially sensitized coating described herein. Laser beams driven and modulated by other mechanisms are equally suitable and are within the purview of this invention.

The following non-limiting examples are given in order to illustrate the invention in greater detail. Laser exposures were made with the use of Scan Scribers made by Laser Graphics System, Inc.

FIG. 1 is a diagram of this device.

The drawing shows: A laser, in this embodiment, an argon ion laser 1, such as the Coherent Radiation model CR 8 laser or the Spectra Physics model 164 laser. A coherent, nearly parallel beam of light 2 is reflected by the first surface mirrors 3 and 9, which in this embodiment, are custom coated for reflection between 450 to 530 nm only by the selective interference technique resulting in the exclusion of 99.99995% of light below 450 nm. The intensity of the laser beam 2 is modulated by the modulator 4 which in this embodiment is an acousto/optical modulator such as a Spectra Physics model LGS 100-5B. The amplitude-modulated beam 5 is then focused into a converging beam 12 by a Cassegranian type reflective optical system 6 such as Spectra Physics model ADS 100-6. The beam 12 is scanned across the imageable surface of plate 10 by means of the planar, first-surface mirror 13, the curved, first surface mirror 9 and the rotating motor 7 driven, truncated-pyramidal, first-surface mirror 8, to arrive at the plate 10 as indicated by the arrows, while the plate 10 is being transported under the line of scan as indicated by the arrow. The image on the plate results from the intensity of the laser beam being modulated in accordance with an input source of information 11, which may be a computer output, magnetic tape output, modified signal from an image reading device with optical arrangement similar to that of FIG. 1 or other suitable means.

Data in all Examples are based upon the use of a Scan Scriber unit of a Laser Graph ® system equipped with a 6 watt argon ion laser. When plates identical to those of Example 3, which were correctly exposable in 0.40 sec/in², were exposed with another Scan Scriber differing essentially in using a commercially available laser with an output of 15 watts, the correct laser exposure speed was determined to be only 0.16 sec/in² or 1.0 minute per 16"×24" newspaper page. Hence the exposure rate appeared to be proportional to the laser output wattage. This relationship was subsequently verified for five wattages in the range of 3 watts to 15 watts. Laser exposure speed data in the last column of Table 1 has been normalized to the 15 watt commercially available laser.

In the copending application, supra, and in this application it is disclosed that positive working light-sensitive layers containing o-quinone diazides having a principal spectral sensitivity in the range of 320 to 450 nm show very poor response to the argon ion laser in the equipment used herein. Their relative photographic speed, even with added colorants, is but 1/10 of negative working diazo compositions. Also, a photopolymer printing plate known to be highly sensitive in the range of 300 to 420 nm is not exposed by the laser equipment used herein.

In view of the sensitivity to UV light shared by three different systems: positive-working diazos, negative-working diazos, and by photpolymers, it was surprising to find that of these three only the negative-working diazos were inherently sensitive to laser light in the range of 450 to 550 nm. This inherent sensitivity can be further heightened by the addition of appropriate colorants as shown herein.

EXAMPLE 1

To a 2000 ml Erlenmeyer flask equipped with a mechanical stirrer containing 990 g (13.2 moles) of 2-methoxyethanol available from Union Carbide as "methyl cellosolve", were added sequentially over several hours the following components: 4.9 g of a polyvinylformal resin commercially available from Monsanto as "Formvar 12/85", 4.9 g of a polymeric condensation product of 4-(phenylamino)-2-methoxybenzene diazonium salt and bis-(4-methoxymethylphenyl) ether, isolated in the form of a mesitylene-sulfonate, as described in U.S. Pat. No. 3,849,393, assigned to Kalle AG, 0.049 g (0.18 mmole) 4-phenylazodiphenylamine, and 0.111 g (0.96 mmole) of 85% aqueous phosphoric acid. After stirring at room temperature for one hour, the solution was filtered through coarse filter paper. This solution will hereinafter be called Stock Solution A.

To 100 g of Stock Solution A, 136.0 mg Remacryl Magenta B (Colour Index No. 42520), available from American Hoechst Corporation, were added. The solution was stirred for 30 minutes and filtered through coarse filter paper.

Fifty ml of the above-dyed solution were whirler-coated at 90 rpm on hydrophilic, anodized, grained aluminum treated in accordance with U.S. Pat. No. 3,220,832, assigned to American Hoechst Corporation. In the same manner, a control plate (containing no dye) was prepared by whirler-coating 50 ml of Stock Solution A on the above-described aluminum. The control plate was used as reference for the exposure speed changes noted in columns 4 and 5 of Table I. In both cases, the coating weight of the dried plates was 0.25 g/m².

The plates were first exposed conventionally in a Berkey/Ascor 30×40 inch exposure unit Model No. 1618-40, to 20 units of light (approximately 20 seconds) as measured by means of the attached integrator. The plates were exposed through a standard Stauffer 21 Stepwedge, developed manually for 45 seconds using an aqueous developer containing 20% by weight of n-propanol, about 1% of surfactant, rinsed with tap water, squeegeed, and finished with an aqueous solution containing about 10% of hydrolyzed starch and 0.5% of phosphoric acid. The plates were then inked in a conventional manner using Imperial Triple Ink available from Lithoplate, Inc. ENCO ® products are manufactured by American Hoechst Corporation. The solidly inked steps on the stepwedge images were then compared, and from this the relative exposure speed was calculated from the property of the Stauffer 21 Stepwedge that each successively denser step on the wedge is 1.41 (the square root of 2) times optically denser than the previous step. In column 4, line 1, of Table 1 the observation is entered that the dyed plate is 75% slower than the control.

In an analogous manner, the laser exposure speed of the plates was measured by subjecting sections of each plate to argon laser scanning by means of a Scan Scriber, described above, with dwell times successively decreasing by a factor of 0.71 (the square root of 0.5); i.e. referring to FIG. 1, the transport of the plate 10 was varied stepwise so that the first inch to be scanned was scanned in 50 seconds; the second, 36 seconds; the third, 25 seconds. The rotational rate of the mirror 8 was varied so as to be proportional to the transporting speed. The image projected onto the plates was an 85 line per inch screen pattern with densities in fifteen steps from solid (100%) to zero (0%). After developing, finishing, and inking the plates as above, the images were compared for retention of highlight dots, shadow plugging, and density of solid areas, and the minimum adequate exposure times were compared. The results are entered in Table 1, column 5, which shows that the control plate requires 70% more exposure than the dyed plate under argon laser exposure.

EXAMPLE 2

Example 1 was repeated, except that 64.0 mg of Neozapon Red BE (C.I. No. 12716) available from BASF, was used instead of the Remacryl dye of Example 1. The results are also recorded in Table 1.

EXAMPLE 3

To a 2000 ml Erlenmeyer flask, equipped with a mechanical stirrer, containing 990 g (13.0 moles) of 2-methoxyethanol, were added sequentially the following components: 5.3 g of a styrene-maleic acid copolymer available from Monsanto as "Lytron 820", 0.50 g (2.9 mmole) of p-toluenesulfonic acid, and 4.2 g of the diazonium compound used in Example 1. After stirring at room temperature for one hour, the solution was filtered through coarse filter paper. This solution will hereafter be called Stock Solution B. Example 1 was then repeated, except that Stock Solution B was used both for the dyed plate and for the control plate, and 136.0 mg of Rhodamine 6GDN Extra (C.I. No. 45160) available from DuPont, were used instead of the Remacryl dye of Example 1. The results are recorded in Table 1. In this case, the laser exposure speed for the plate made from the dyed solution was 0.40 sec/in² or 2.50 min. per 16"×24" newspaper page when exposed with a laser with an output of 6 watts. The plate was developed with a dilute aqueous alkaline developer containing surfactant.

EXAMPLE 4

Example 1 was repeated, except that 136.0 mg of Sandocryl Red B-6B (C.I. No. 48013), available from Sandoz, was used instead of the Remacryl dye of Example 1. The results are recorded in Table 1.

EXAMPLE 5

Example 1 was repeated except that 136.0 mg of Sudan Yellow (C.I. No. 12055) available from BASF, were used instead of the Remacryl dye of Example 1. The results are recorded in Table 1.

EXAMPLE 6

Example 1 was repeated except that 136.0 mg of Spirit Soluble Fast Pink B, formerly available from BASF, were used instead of the Remacryl dye of Example 1. The results are recorded in Table 1.

EXAMPLE 7

Example 1 was repeated except that 136.0 mg of Rhodamine FB (C.I. No. 45170) available from BASF were used instead of the Remacryl dye of Example 1. The results are recorded in Table 1.

EXAMPLE 8

Example 1 was repeated except that 136.0 mg. of Oracet Red B (Colour Index Solvent Red 16) available from CIBA-Geigy were used instead of the Remacryl dye of Example 1. The results are recorded in Table 1.

EXAMPLE 9

Example 3 was repeated, except that 136.0 mg of Azo Eosin G (C.I. No. 14710) available from DuPont were used instead of the Rhodamine dye of Example 3. The results are recorded in Table 1. The plate was developed with a dilute aqueous alkaline developer containing surfactant.

EXAMPLE 10

Example 1 was repeated except that 136.0 mg of Rhodamine 6 GDN (C.I. No. 45160) available from DuPont were used instead of the Remacryl dye of Example 1 and Hostaphan H polyester film, available from American Hoechst Corporation, silicated according to the published German patent application DT-AS 1228 414 for lithographic printing plates was used instead of the aluminum carrier of Example 1. The results are recorded in Table 1.

EXAMPLE 11

A coating solution was prepared as in Example 1 from 1.59 g of the diazonium compound of Example 1, 6.37 g of "Formvar 12/85", 1.22 g of Rhodamine 6 GDN, 0.045 g of 85% aqueous phosphoric acid and 0.04 g of 4-phenylazodiphenylamine in a mixture of 79.35 g of 2-methoxyethanol and 11.34 g of ethylene glycol monomethyl ether acetate varying the ratio of the first two ingredients as shown below. Four plates were prepared from these solutions using the method of Example 1, and exposed and developed as in Example 1. Plate 11a was the control plate.

| Plate | g of Diazonium Compound | g of Resin |
| --- | --- | --- |
| 11a | 1.59 | 6.37 |
| 11b | 2.63 | 5.33 |
| 11c | 3.98 | 3.98 |
| 11d | 5.33 | 2.63 |

The results are recorded in Table 1.

EXAMPLE 12

Example 11 was repeated except that instead of the diazonium compound of Example 11, a polymeric condensation product of 4-(phenylamino)-2-methoxybenzene diazonium sulfate with bis-(4-methoxymethylphenyl) ether was used, in the same four proportions to give four plates, 12a, 12b, 12c, & 12d, of which 12a was the control plate. The exposure results are recorded in Table 1.

EXAMPLE 13

Example 11 was repeated, except that, instead of the diazonium compound of Example 11, a polymeric condensation product of diphenylamine-4-diazonium chloride with formaldehyde was used. The proportions of diazonium compound and resin were as follows:

| Plate | g of Diazonium Compound | g of Resin |
|---|---|---|
| 13a | 2.63 | 5.33 |
| 13b | 3.98 | 3.98 |
| 13c | 5.33 | 2.63 |

Plate 13a was the control; the results are recorded in Table 1.

EXAMPLE 14

Example 13 was repeated except that instead of the diazonium compound of Example 12, a polymeric condensation product of 3-methoxydiphenyl-4-diazonium chloride with formaldehyde was used. Plate 14a was the control; the results are recorded in Table 1.

EXAMPLE 15

A coating solution of 0.5 g of "Lytron 820", 0.05 g of p-toluene-sulfonic acid, 0.06 g of Rhodamine 6 GDN extra, 100 g of 2-methoxyethanol and 0.4 g of the diazonium compound of Example 1 was prepared and coated as in Example 1. The plate was exposed as in Example 1, but was developed with a dilute aqueous alkaline developer containing surfactant, rather than alcohol containing developer used before. The exposure was satisfactory. The effective speed was 0.19 secs/in. (normalized to a 15 watt Argon Ion laser).

EXAMPLE 16

A coating solution was prepared as in Example 1 from 0.35 g of naphthoquinone(1,2)-diazide(2)-sulfonic acid(5) monoester of 2,3,4-trihydroxybenzophenone, 1.16 g of a cresol/formaldehyde novolak resin available as Alnovol 429 from Albert-Reichold, Wiesbaden, Germany, 0.73 g of Rhodamine 6GDN-extra and 60.0 g of 2-methoxyethyl acetate. From this solution, plates were prepared and exposed as in Example 1. Adequate conventional exposure to give a positive image, developable with Enco® PD positive plate developer, was obtained with 7 units of light as control delivered by the Berkey Ascor unit of Example 1. This is an expected result with conventional exposure. Upon 6 watt laser exposure, in the manner of Example 1, the plate was shown to require more than 7.8 seconds of exposure per square inch.

EXAMPLE 17

Example 1 was repeated, except that Dowetch® Deadline magnesium engraving plates suitable for the preparation of shallow relief plates for letterpress printing available from Dow Chemical were used instead of the aluminum printing plates of Example 1. The exposed and developed plates were then etched with Dowetch® etchant to give an image in relief where these raised areas corresponded to the laser hardened areas which remained after development.

TABLE I

| EXAMPLE NO. | DYE COLOUR INDEX NO. | DIAZONIUM COMPOUND | RELATIVE SPEED OF EXPERIMENTAL PLATES VS. CONTROL PLATES | | ABSOLUTE LASER EXPOSURE SPEED NORMALIZED TO 15W (SECONDS/IN$^2$) |
|---|---|---|---|---|---|
| | | | Conventional Exposure | Laser Exposure | |
| 1 | 42520 | 1 | −75% | +70% | 0.27 |
| 2 | 12716 | 1 | −30 | +100 | 0.23 |
| 3 | 45160 | 1 | 0 | +185 | 0.16 |
| 4 | 48013 | 1 | −30 | +40 | 0.33 |
| 5 | 12055 | 1 | −30 | +40 | 0.33 |
| 6 | Spirit Soluble Fast Pink B | 1 | 0 | +100 | 0.23 |
| 7 | 45170 | 1 | 0 | +100 | 0.23 |
| 8 | Oracet Red B | 1 | −30 | +40 | 0.33 |
| 9 | 14710 | 1 | −50 | +40 | 0.33 |
| 10 | 45160 | 1 | −60 | +100 | 0.23 |
| 11a | 45160 | 1 | — | — | 0.38 |
| 11b | 45160 | 1 | −30 | +20 | 0.31 |
| c | 45160 | 1 | −65 | +100 | 0.19 |
| d | 45160 | 1 | −75 | +140 | 0.16 |
| 12a | 45160 | 2 | — | — | 0.38 |
| b | 45160 | 2 | −50 | +20 | 0.31 |
| c | 45160 | 2 | −75 | +100 | 0.19 |
| d | 45160 | 2 | −85 | +140 | 0.16 |
| 13a | 45160 | 3 | — | — | 0.88 |
| b | 45160 | 3 | 0 | +180 | 0.31 |
| c | 45160 | 3 | −30 | +180 | 0.31 |
| 14a | 45160 | 4 | — | — | 1.25 |
| b | 45160 | 4 | −30 | +60 | 0.79 |
| c | 45160 | 4 | −30 | +80 | 0.60 |

It will be obvious to those skilled in the art that many modifications may be made within the scope of the present invention without department from the spirit thereof, and the invention includes all such modifications.

What is claimed is:

1. In a photochemical process for the preparation of printing plates wherein a printing plate comprising a photosensitive composition coated on a support is exposed to a pattern of laser light, the intensity of which light is modulated in accordance with an input source of information, and said printing plate is subsequently developed by removal from said support of that portion of the photosensitive coating composition which is not exposed to said pattern of laser light, the improvement comprising utilizing a pattern of laser light generated by a laser which has a significant emission of light at a wavelength greater than about 450 nm, and utilizing as a photosensitive composition a mixture consisting essentially of: (1) a negative-working condensate or a para-amino benzene diazonium compound present in an effective amount sufficient to sensitize said photosensitive composition to laser light, and (2) a colorant capable of absorbing light in the spectral range between about 450–550 nm, said colorant selectively sensitizing the condensate to said laser light at a wavelength greater than about 450 nm, and being selected from the group consisting of azo, triarylmethane, xanthene and methine compounds.

2. A process according to claim 1 wherein said condensate is a polymeric condensation product of a substituted p-aminobenzene diazonium salt of a dialkoxy aromatic compound.

3. A process according to claim 1 wherein said condensate is a polymeric condensation product selected from the group consisting of 3-methoxydiphenylamine-4-diazonium mesitylene sulfonate condensed with bis-(4-methoxymethylphenyl)ether, 3-methoxydiphenylamine-4-diazonium sulfate condensed with bis-(4-methoxymethylphenyl) ether, diphenylamine-4-diazonium chloride condensed with formaldehyde, and 3-methoxydiphenylamine-4-diazonium chloride condensed with formaldehyde.

4. A process according to claim 1 wherein said photosensitive composition is coated on said support such that the diazonium compound is present in a quantity within the range of about 0.01 to 0.8 gram per square meter, and said colorant is present in a quantity within the range of about 0.01 to 0.5 gram per square meter.

5. A process according to claim 4 wherein said support is a metal plate.

6. A process according to claim 4 wherein said support is a film.

7. A process according to claim 1 wherein said colorant is Rhodamine 6 GDN, C.I. 45,160.

8. A process according to claim 1 wherein said colorant is Neozapon Red BE, C.I. 12,716.

9. A process according to claim 1 wherein said colorant is Rhodamine FB, C.I. 45,170.

10. A process according to claim 1 wherein said colorant is Remacryl Magenta B, C.I. 42,520.

11. A process according to claim 1 wherein said colorant is Azo Eosin G, C.I. 14,710.

12. A process according to claim 1 wherein said colorant is Sandocryl Red B-6B, C.I. 48,013.

13. A process according to claim 1 wherein said colorant is Sudan Yellow, C.I. 12,055.

14. A process according to claim 1 wherein said colorant is Oracet Red B.

* * * * *